(12) United States Patent
Seo

(10) Patent No.: US 6,274,455 B1
(45) Date of Patent: Aug. 14, 2001

(54) METHOD FOR ISOLATING SEMICONDUCTOR DEVICE

(75) Inventor: Su Jin Seo, Cheongju (KR)

(73) Assignee: Hyundai Electronics Industries Co., Ltd., Kyoungki-Do (KR)

(*) Notice: Subject to any disclaimer, the term of this patent is extended or adjusted under 35 U.S.C. 154(b) by 0 days.

(21) Appl. No.: 09/219,529

(22) Filed: Dec. 23, 1998

Related U.S. Application Data

(63) Continuation-in-part of application No. 09/095,927, filed on Jun. 12, 1998, now Pat. No. 6,063,691.

(30) Foreign Application Priority Data

Dec. 29, 1997 (KR) .................................................. 97/76818
Dec. 10, 1998 (KR) .................................................. 98/54125

(51) Int. Cl.⁷ .................................................. H01L 21/76
(52) U.S. Cl. .................. 438/400; 438/424; 438/430; 438/431; 438/427
(58) Field of Search .................................... 438/407, 424, 438/430, 431, 427

(56) References Cited

U.S. PATENT DOCUMENTS

| | | | |
|---|---|---|---|
| 4,493,740 | * | 1/1985 | Komeda . |
| 5,786,263 | * | 7/1998 | Perera . |
| 6,037,237 | * | 3/2000 | Park et al. . |
| 6,136,664 | * | 10/2000 | Economikos et al. . |

OTHER PUBLICATIONS

"Chemical–mechanical polishing of interlayer dielectric: A review", Iqbal Ali et al., Solid State Technology, Oct. 1994, pp. 63–68.

"HDP–CVD: Trying to lasso lightning", Ed Korczynski, Solid State Technology, Apr. 1996, pp. 64–73.

* cited by examiner

Primary Examiner—John F. Niebling
Assistant Examiner—Josetta Jones
(74) Attorney, Agent, or Firm—Fleshner & Kim, LLP

(57) ABSTRACT

A method for isolating a semiconductor device is disclosed. The method includes the steps of forming a buffer film on a semiconductor substrate and an oxide prevention film on the buffer film, etching the buffer,film and the oxide prevention film of a device isolation region, etching the substrate using the oxide prevention film as a mask and forming a trench, forming an oxidizable film on the surface of the trench, forming an insulation film filled into the trench by oxidizing the oxidizable film, and removing the buffer film and the oxide prevention film, for thereby enhancing the isolation characteristic of the device.

21 Claims, 4 Drawing Sheets

METHOD FOR ISOLATING SEMICONDUCTOR DEVICE

This application is a CIP of application Ser. No. 09/095,927 filed Jun. 12,1996 and U.S. Pat. No. 6,063,691.

BACKGROUND OF THE INVENTION

1. Field of the Invention

The present invention relates to a method for isolating a semiconductor device, and in particular to an improved method for isolating a semiconductor device which is well applicable to a shallow trench isolation for filling an insulation layer into a shallow trench.

2. Description of the Background Art

FIGS. 1A through 1F are views illustrating a known semiconductor device isolation method. As shown in FIG. 1A, an oxide film, which is a first insulation film 2, is formed on a semiconductor substrate 1 to a thickness of 500~100 Å, and a nitride film, which is a second insulation film 3, is formed on the first insulation film 2 to a thickness of 2000 Å. In addition, a photoresist film 4 is formed on the second insulation film 3.

As shown in FIG. 1B, the photoresist film 4 is patterned through a conventional exposing and developing processes for exposing the surface of the second insulation film 3, and then the first insulation film 2 and the second insulation film 3 are sequentially etched using the resultant structure as a mask.

As shown in FIG. 1C, the substrate 1 is etched using the first insulation film 2 and the second insulation film 3 as a mask for thereby forming a trench 5. A shallow third insulation film 6, which is an oxide film, is formed in the trench 5 based on the thermal oxidation process. Thereafter, a fourth insulation film 7 is formed on the second insulation film 3. As a result, the trench 5 is filled by the fourth insulation film 7.

Here, the fourth insulation film 7 is formed as an oxide film based on a high density plasma chemical vapor deposition method, and then a heat treatment is performed for forming a good quality device isolation film for thereby densifying the fourth insulation film 7.

As shown in FIG. 1D, the fourth insulation film 7 is etched by a chemical-mechanical polishing (CMP) method until the surface of the second insulation film 3 is exposed. At this time, the second insulation film 3 acts as an etching stop film.

As shown in FIG. 1E, the first insulation film 2 and the second insulation film 3 are removed from the substrate 1 for thereby completing a known semiconductor device isolation process. The second insulation film 3 is removed based on a wet etching method in which $H_3PO_4$ solution is used.

The known semiconductor device isolation method has the following problems.

First, the polishing process for forming an oxide film for filling the trench and etching the oxide film is implemented by an expensive semiconductor apparatus. In addition, a large amount of slurry which is a polishing material used during the CMP process is used for thereby increasing the fabrication cost.

Second, the surface of the semiconductor substrate may be damaged due to the stress of a thick silicon nitride film during the high temperature heat treatment after the HDP CVD oxide film, which is the fourth insulation film, is deposited.

Third, when chemically and mechanically polishing the HDP CVD oxide film, which is the fourth insulation film, it is difficult to control the uniformity of the surface of the oxide film.

Fourth, when etching the fourth insulation film using the CMP process, the third and fourth insulation films at the corner portions of the trench are etched to a predetermined thickness lower than the surface of the semiconductor substrate (refer to a dotted line in FIG. 1E). Therefore, when depositing and etching the polysilicon for forming a gate electrode in the following process, which is not illustrated in FIG. 1, the polysilicon deposited at the corner portions of the trench may not be etched for thereby causing a short circuit.

SUMMARY OF THE INVENTION

Accordingly, it is an object of the present invention to provide a method for isolating a semiconductor device which overcomes the aforementioned problems encountered in the conventional art.

It is another object of the present invention to provide a method for isolating a semiconductor device which is capable of increasing the densification of an insulation film filled into the trench for thereby enhancing the isolation characteristic of the device.

It is another object of the present invention to provide a method for isolating a semiconductor device which is capable of enhancing the isolation characteristic of the device by uniformly forming an insulation film in different size trenches formed in a cell region and a peripheral circuit region of the memory device.

To achieve the above objects, there is provided a method for isolating a semiconductor device according to a first embodiment of the present invention which includes the steps of forming a buffer film on a semiconductor substrate and an oxide prevention film on the buffer film, etching the buffer film and the oxide prevention film of a device isolation region, etching the substrate using the oxide prevention film as a mask and forming a trench, forming an oxidizable film on the surface of the trench, forming an insulation film filled into the trench by oxidizing the oxidizable film, and removing the buffer film and the oxide prevention film.

To achieve the above objects, there is provided a method for isolating a semiconductor device according to a second embodiment of the present invention which includes the steps of forming a buffer film on a semiconductor substrate and an oxide prevention film on the buffer film, removing the buffer film and the oxide prevention film from a first trench and a second trench wider than the first trench, forming a first trench and second trench by etching the substrate using the oxide prevention film as a mask, forming a first oxidizable film in the first trench and a second oxidizable film thicker than the first oxidizable film in the second trench, and forming a first insulation film and a second insulation film filling the first trench and the second trench, respectively, by oxidizing the oxidizable films.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The embodiments of the present invention will be explained with reference to the accompanying drawings.

FIGS. 2A through 2E illustrate an isolation method for a semiconductor device according to a first embodiment of the present invention.

Figure 1A:
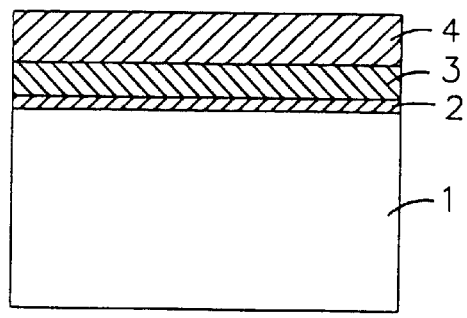
FIGS. 1A through 1E are cross-sectional views illustrating a known semiconductor device isolation method.
Figure 1B:
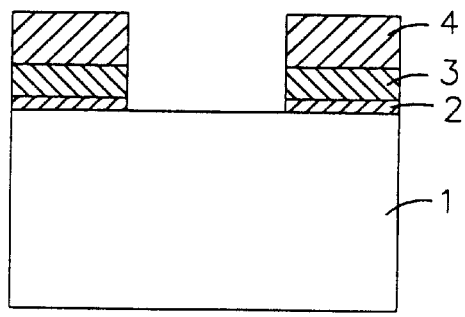
Figure 1C:
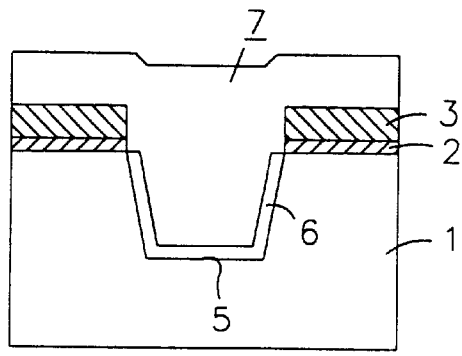
Figure 1D:
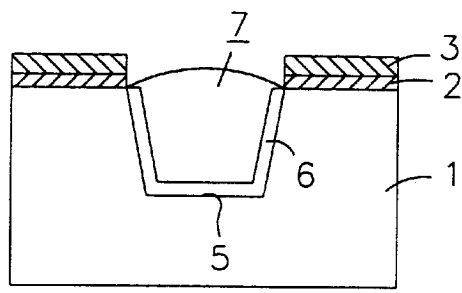
Figure 1E:
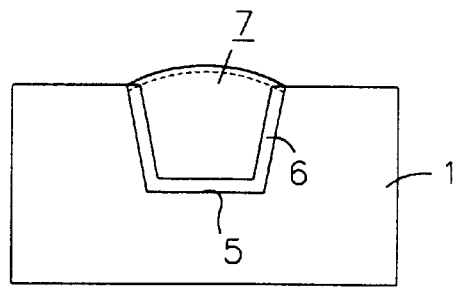
Figure 2A:
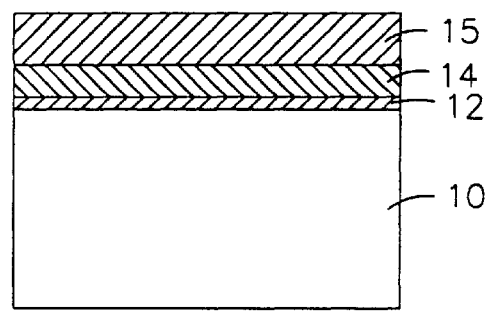
FIGS. 2A through 2E are cross-sectional views illustrating a semiconductor device isolation method according to a first embodiment of the present invention.

First, as shown in FIG. 2A, an oxide film, which is a buffer film 12, is formed on a semiconductor substrate 10 to a thickness of 50~100 Å, and a nitride film, which is an oxide prevention film 14, is formed on the buffer film 12 to a thickness of 500~2000 Å, and then a photoresist film 15 is formed on the oxide prevention film 12.

Figure 2B:
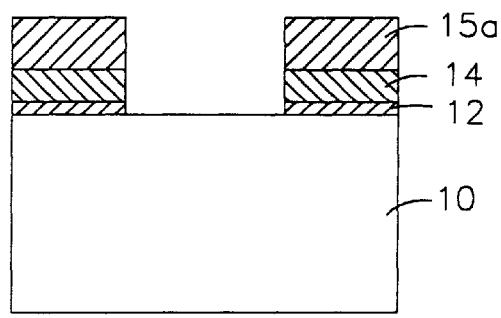

As shown in FIG. 2B, a photoresist film 15 is patterned through a conventional exposing and developing processes for defining a device isolation region in a cell region and a peripheral circuit region for thereby forming a photoresist film pattern 15a. The buffer film 12 and the oxide prevention film 14 are etched and patterned using the photoresist film pattern 15a as a mask. The photoresist film pattern 15a is removed based on the wet etching method.

Figure 2C:
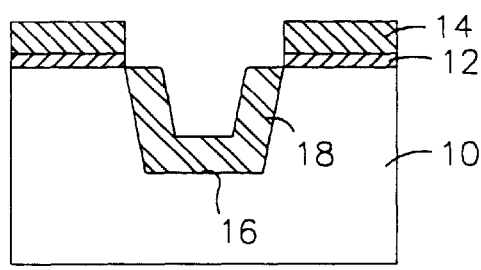

As shown in FIG. 2C, the substrate 10 is etched using the buffer film 12 and the oxide prevention film 14 as a mask for thereby forming a trench 16. In addition, an oxidizable film 18 is formed in the trench 16 to a thickness of 1000 Å. As the oxidizable film 18, the polysilicon film in which a P-type or N-type dopant is doped is formed based on the CVD or an epitaxial silicon film is formed. When forming the epitaxial silicon film, $SiH_2Cl_2$(DCS: Dichlorosilane) is provided into the interior of a reaction chamber as a silicon source, and $B_2H_6$ (Diborane) is provided thereinto as a P-type dopant. In addition, forming an epitaxial silicon film in the reaction chamber, HCl gas may be provided thereinto for delaying the nuclear formation time of a silicon atom.

Figure 2D:
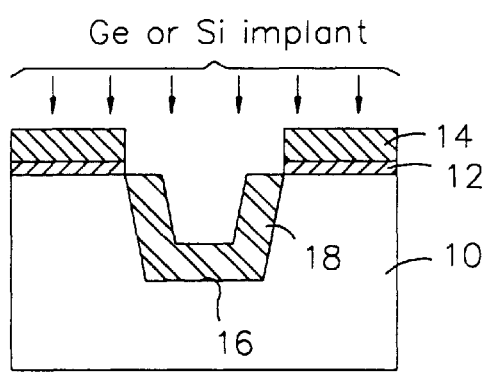

As shown in FIG. 2D, Ge or Si is ion-implanted at a predetermined angle into the oxidizable film 18 of the trench 16. In addition, the oxidizable film 18 and the substrate 10 are oxidized for filling the trench 16 for thereby forming the insulation film 20. Here, Ge or Si is implanted for increasing the oxidation speed by changing the crystal structure of the oxidizable film 18 to a non-amorphous state, so that the substrate is less oxidized. The oxidizing process is performed under an oxygen environment and at a temperature of 800~900° C. in a furnace.

Figure 2E:
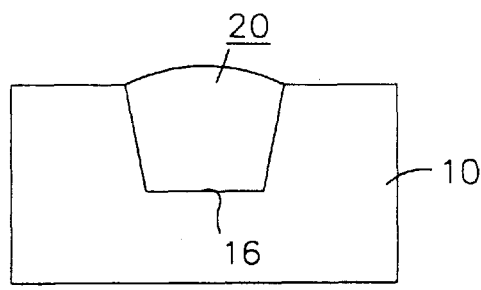

As shown in FIG. 2E, the buffer film 12 and the oxide prevention film 14 are wet-etched and removed for thereby completing the isolation process for a semiconductor device according to the present invention.

FIGS. 3A through 3G are views illustrating an isolation method for a semiconductor device according to a second embodiment of the present invention.

Figure 3A:
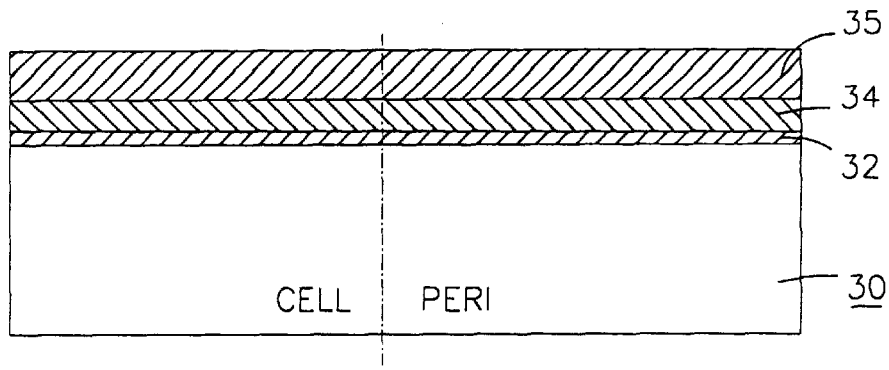
FIGS. 3A through 3G are cross-sectional views illustrating a semiconductor device isolation method according to a second embodiment of the present invention.

First, as shown in FIG. 3A, an oxide film, which is a buffer film 32, is formed on a semiconductor substrate 30 having a cell region and a peripheral region to a thickness of 50~100 Å by a thermal oxide process. A nitride film, which is an oxide prevention film 35, is formed on the buffer film 32 to a thickness of 500~2000 Å, and a first photoresist film 35 is formed on the oxide prevention film 35.

Figure 3B:
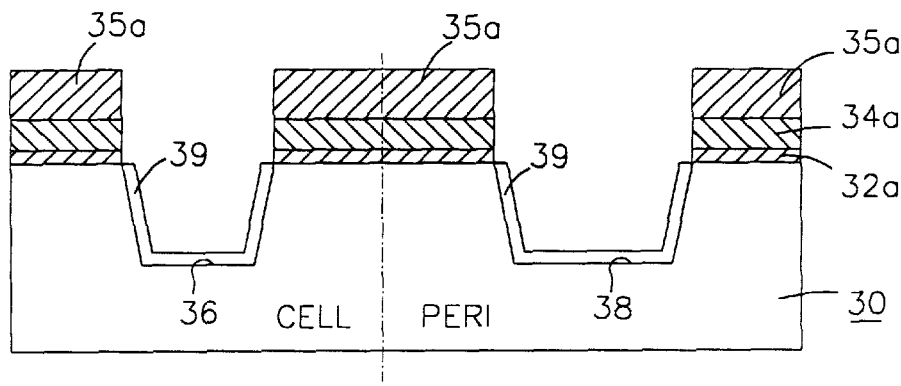

Next, as shown in FIG. 3B, the first photoresist film 35 is patterned through a conventional exposing and developing prcesses for difining a device isolation region in each of the cell region and the peripheral circuit region for thereby forming a first photoresist film pattern 35a. The buffer film 32 and the oxide prevention film 35 are removed using the first photoresist pattern 35a as a mask for thereby forming a buffer film 32a and an oxide prevention film pattern 35a. Thereafter, the first photoresist film pattern 35a is removed.

The substrate 30 is etched using the buffer film 32a and the oxide prevention film pattern 35a, and then a first trench 36 is formed in the cell region, and a second trench 38 is formed in the peripheral circuit region. At this time, the width of the second trench 38 of the peripheral circuit region is wider than the first trench 36 in the cell region. A thin oxide film, which is first insulation film 39, is formed on the lower surface and lateral surface of the first and second trenches 36 and 38.

Figure 3C:
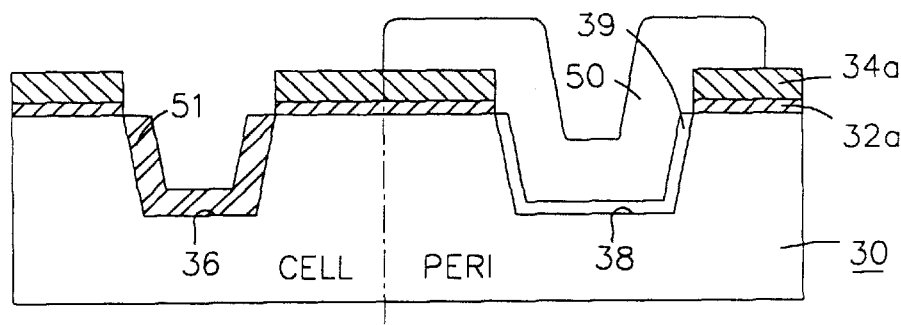

As shown in FIG. 3C, the first insulation film 39 of the cell region is removed using HF solution by masking the second trench 38 of the peripheral circuit region using the second photoresist pattern 50 for thereby removing the second photoresist film pattern 50. In addition, a silicon layer, which is a first oxidizable film 51, is formed on the surface of the first trench 36 of the cell region to a thickness of 1000 Å based on a selective epitaxial method.

Figure 3D:
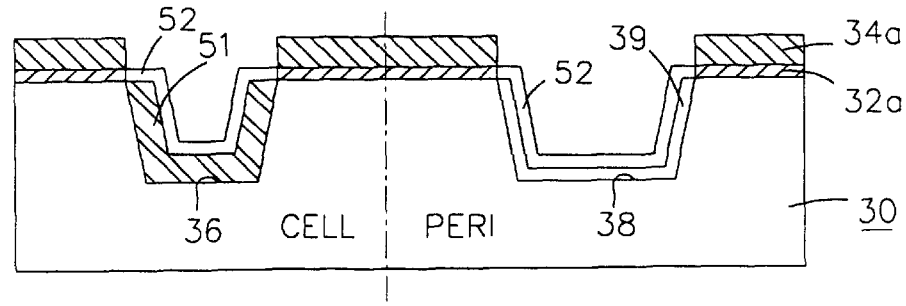

As shown in FIG. 3D, an oxide film, which is a second insulation film 52, is formed on the first oxidizable film 51 of the first trench 36 and the first insulation film 39 of the second trench 38 based on an oxidation process.

Figure 3E:
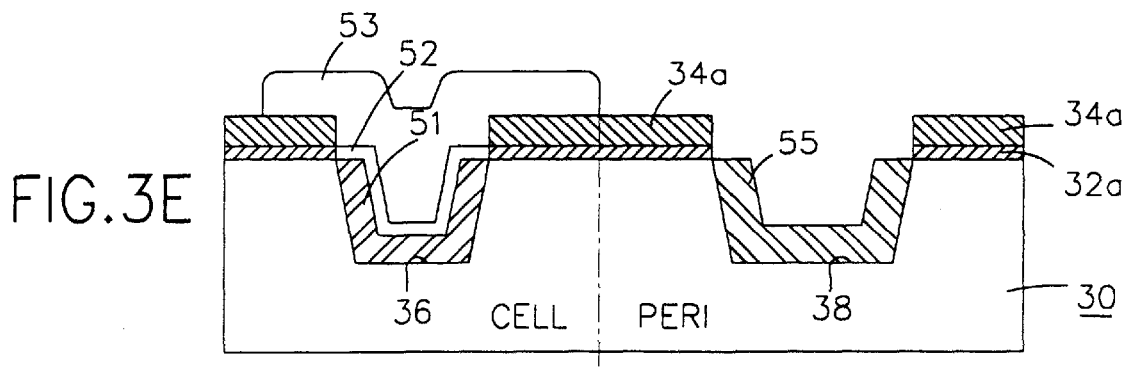

As shown in FIG. 3E, the first insulation film 39 and the second insulation film 52 are removed using HF solution by masking the first trench 36 using the third photoresist pattern 53, and then the third photoresist film pattern 53 is removed. A silicon layer, which is a second oxidizable film 55, is formed on the second trench 38 to a thickness of 2000 Å based on the selective epitaxial growth method.

The first oxidizable film 51 is formed to be thinner than the thickness of the second oxidizable film 55 for the reason that since the width of the first trench 36 is narrower than the second trench 38, the first trench 36 is filled by the oxide film at a predetermined speed faster than that in the second trench 38. Therefore, the first oxidizable film 51 is formed to be thinner than the second oxidizable film 55. The thicknesses of the first and second oxidizable films 51 and 55 are controlled in accordance with the widths of the first and second trenches 36 and 38.

Figure 3F:
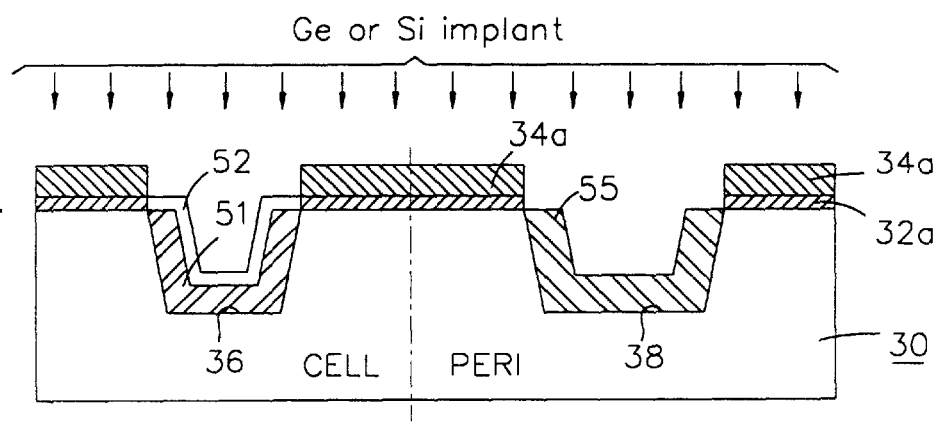

As shown in FIG. 3F, Ge or Si is ion-implanted at a predetermined angle into the first oxidizable film 51 and the second oxidizable film 55 of the first trench 36 and the second trench 38 using the oxide prevention film 34 as a mask. The ion implantation of Ge and Si is performed for the reason that the first oxidizable film 51 and the second oxidizable film 55 is faster oxidized by changing the crystal structures of the first and second oxidizable films 51 and 55 to a non-amorphous state, whereby the substrate 30 is less oxidized than the first and second oxidizable films 51 and 55.

In addition, the substrate 30 adjacent to the first trench 36 and the second trench 38 and the first oxidizable film 51 and the second oxidizable film 55 are oxidized for filling the first trench 36 and the second trench 38 for thereby forming the third insulation film 57 and the fourth insulation film 59.

Figure 3G:
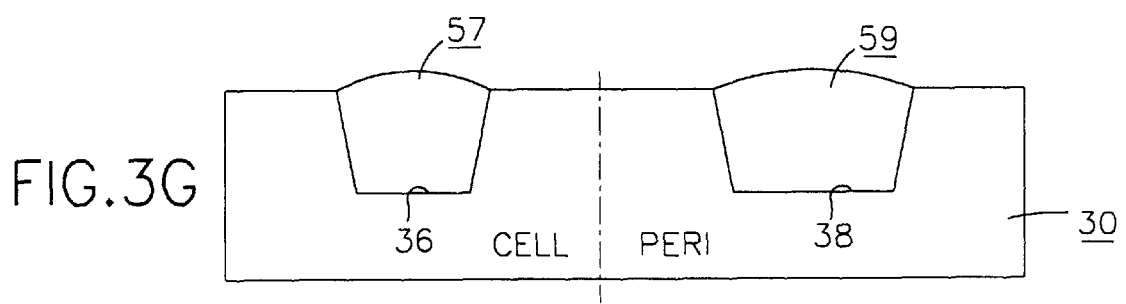

Thereafter, as shown in FIG. 3G, the buffer film 32a and the oxide prevention film pattern 34a are wet-etched and removed for thereby completing a formation of the isolation film of the semiconductor device according to the present invention.

As described above, the isolation method of a semiconductor device according to the present invention has the following advantages.

First, in order to fill the insulation film into the trench, an expensive semiconductor apparatus such as a CVD apparatus and a CMP apparatus is not used. The oxidizable film is formed in the trench is then oxidized for thereby decreasing the fabrication cost.

Second, since the insulation film filled into the trench is used as an oxide film by the oxidation process, the densification is increased, and the isolation characteristic of the device is enhanced.

Third, an insulation film is uniformly formed in different size trenches formed in the cell region and peripheral region of the memory device for thereby enhancing the isolation characteristic of the device.

Fourth, the oxidation process is implemented at a lower temperature by changing the crystal structure of the oxidizable film in the trench to a non-amorphous state through an ion-implantation process, the nitride film may be formed to a predetermined thickness below 500 Å for thereby preventing any defects of the semiconductor substrate.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A method for isolating a semiconductor device, comprising:
    forming a buffer film on a semiconductor substrate and an oxide prevention film on the buffer film;
    etching the buffer film and the oxide prevention film at a device isolationregion;
    etching the substrate using the oxide prevention film as a mask to form a trench in the substrate;
    forming an oxidizable film on a surface of the trench, wherein said oxidizable film is formed of a silicon film, and further comprising doping the oxidizable film with a dopant selected from the group consisting of a P-type dopant and N-type dopant;
    forming an insulation film that fills the trench by oxidizing the oxidizable film; and
    removing the buffer film and the oxide prevention film.

2. The method of claim 1, wherein said buffer film is formed of an oxide film, and said oxide prevention film is formed of a nitride film.

3. The method of claim 1, wherein said silicon film is a polysilicon film or an epitaxial silicon film.

4. The method of claim 3, wherein the oxidizable film is formed of an epitaxial silicon film, and wherein $SiH_2Cl_2$ (Dicholorosilane) is provided into the interior of a reaction chamber as a silicon source when forming the epitaxial silicon film, and $B_2H_6$ (Diborane) is provided thereinto as a P-type dopant.

5. The method of claim 4, wherein HCl gas is provided into the interior of the reaction chamber for controlling the growth of the epitaxial silicon film.

6. The method of claim 1, wherein said oxidation process is performed under an oxygen environment and at a temperature of 800~900° C.

7. A method for isolating a semiconductor device, comprising:
    forming a buffer film on a semiconductor substrate and an oxide prevention film on the buffer film;
    removing the buffer film and the oxide prevention film in a first trench region and a second trench region, wherein a width of the second trench region is greater than a width of the first trench region;
    forming a first trench and second trench in the substrate by etching the substrate using the oxide prevention film as a mask;
    forming a first oxidizable film in the first trench and a second oxidizable film in the second trench, wherein the second oxidizable film is thicker than the first oxidizable film; and
    forming a first insulation film and a second insulation film filling the first trench and the second trench, respectively, by oxidizing the oxidizable films.

8. The method of claim 7, wherein said step for forming the first and second oxidizable films comprises:
    forming a first insulation film on a lower surface and a lateral surface of the first trench and the second trench, respectively;
    removing the first insulation film from the first trench;
    forming a first oxidizable film in the first trench;
    forming a second insulation film on the oxidizable film of the first trench and the first insulation film of the second trench, respectively;
    removing the first and second insulation films from the second trench; and
    forming a second oxidizable film in the second trench.

9. The method of claim 8, wherein said first oxidizable film is formed to a thickness of about 1000 Å and said second oxidizable film is formed to a thickness of about 2000 Å.

10. The method of claim 7, further comprising ion implanting a dopant into the first and second oxidiziblefilms wherein the dopant is selected from the group consisting of Ge and Si.

11. The method of claim 7, wherein said first insulation film and said second insulation film are formed by oxidizing the first and second oxidizable films and the substrate.

12. The method of claim 7, wherein said first insulation film and second insulation film are formed by oxidizing the surfaces of the first and second oxidizable films.

13. The method of claim 7, wherein said buffer film is formed of an oxide film, and said oxide prevention film is formed of a nitride film.

14. The method of claim 7, wherein said oxidizable films are formed of a polysilicon film or an epitaxial silicon film.

15. The method of claim 14, wherein the oxidizable film is formed of an epitaxial silicon film, and wherein $SiH_2Cl_2$ (Dicholorosilanc) is provided into the interior of reaction chamber as a silicon source when forming the epitaxial silicon film, and $B_2H_6$ (Diborane) is provided thereinto as a P-type dopant.

16. The method of claim 15, wherein HCl gas is provided into the interior of the reaction chamber for controlling the growth of the epitaxial silicon film.

17. The method of claim 7, wherein said first trench is formed in the cell region of the semiconductor device, and said second trench is formed in a peripheral circuit region of the semiconductor device.

18. The method of claim 7, wherein said oxidation process is performed under an oxygen environment and at a temperature of 800~900° C.

19. The method of claim 7, wherein the oxidizing step causes the first insulation film to fill the first trench, and causes the second insulation film to fill the second trench.

20. A method for isolating a semiconductor device, comprising:
    forming a buffer film on a semiconductor substrate and an oxide prevention film on the buffer film;

removing the buffer film and the oxide prevention film in a first trench region and a second trench region, wherein a width of the second trench region is greater than a width of the first trench region;

forming a first trench and second trench in the substrate by etching the substrate using the oxide prevention film as a mask;

forming a first oxidizable film in the first trench and a second oxidizable film in the second trench; and forming a first insulation film and a second insulation film filling the first trench and the second trench, respectively, by oxidizing the oxidizable films.

21. A method for isolating a semiconductor device, comprising:

forming a buffer film on a semiconductor substrate and an oxide prevention film on the buffer film;

removing the buffer film and the oxide prevention film in a first trench region and a second trench region;

forming a first trench and second trench in the substrate by etching the substrate using the oxide prevention film as a mask;

forming a first oxidizable film in the first trench and a second oxidizable film in the second trench, wherein the second oxidizable film is thicker than the first oxidizable film; and forming a first insulation film and a second insulation film filling the first trench and the second trench, respectively, by oxidizing the oxidizable films.

* * * * *